United States Patent
Soares et al.

(10) Patent No.: US 9,595,872 B2
(45) Date of Patent: Mar. 14, 2017

(54) ADJUSTMENT OF CIRCUIT OPERATIONS IN RESPONSE TO AC LINE DISTORTION

(71) Applicant: Bose Corporation, Framingham, MA (US)

(72) Inventors: Manoel Soares, Natick, MA (US); Michael B. Nussbaum, Newton, MA (US); Joseph Taher Mossoba, Cambridge, MA (US)

(73) Assignee: Bose Corporation, Framingham, MA (US)

( * ) Notice: Subject to any disclaimer, the term of this patent is extended or adjusted under 35 U.S.C. 154(b) by 163 days.

(21) Appl. No.: 14/521,089

(22) Filed: Oct. 22, 2014

(65) Prior Publication Data

US 2016/0118897 A1    Apr. 28, 2016

(51) Int. Cl.
| | |
|---|---|
| H02M 1/42 | (2007.01) |
| H02M 1/12 | (2006.01) |
| H02M 1/14 | (2006.01) |
| H02M 1/00 | (2006.01) |
| H02M 3/335 | (2006.01) |
| G01R 19/04 | (2006.01) |

(52) U.S. Cl.
CPC ........ *H02M 3/33507* (2013.01); *G01R 19/04* (2013.01); *H02M 1/4258* (2013.01); *H02M 1/12* (2013.01); *H02M 1/14* (2013.01); *H02M 2001/0022* (2013.01); *Y02B 70/126* (2013.01)

(58) Field of Classification Search
CPC .... H02M 1/42; H02M 1/4208; H02M 1/4233; H02M 1/4258; H02M 3/33507; H02M 3/33515; H02M 3/33525; H02M 3/3353; H02M 3/33538; H02M 3/33546; H02M 3/33533; H02M 3/33569; G01R 19/04
USPC ........ 363/13, 15–16, 20, 21.01–21.04, 21.12
See application file for complete search history.

(56) References Cited

U.S. PATENT DOCUMENTS

| | | | |
|---|---|---|---|
| 4,751,604 A | 6/1988 | Wilkinson | |
| 6,055,167 A * | 4/2000 | Shamkovich | ....... H02M 1/4225 323/300 |
| 6,288,913 B1 | 9/2001 | White | |
| 7,266,001 B1 | 9/2007 | Notohamiprodjo et al. | |

(Continued)

FOREIGN PATENT DOCUMENTS

| | | |
|---|---|---|
| CN | 103 702 490 | 4/2014 |
| EP | 0 637 789 | 2/1995 |

(Continued)

OTHER PUBLICATIONS

International Search Report and Written Opinion; PCT/US2015/056461; Mar. 11, 2016; 13 pp.

(Continued)

*Primary Examiner* — Jessica Han
*Assistant Examiner* — David A. Singh
(74) *Attorney, Agent, or Firm* — Fish & Richardson P.C.

(57) ABSTRACT

An example method for controlling a circuit may include determining an input signal in a circuit, the input signal comprising distortion; determining a fundamental component of the input signal; determining an error of the input signal using the input signal and the fundamental component; determining a distortion metric using the error; and controlling the circuit as a function of the distortion metric.

20 Claims, 7 Drawing Sheets

(56) References Cited

U.S. PATENT DOCUMENTS

| | | | | |
|---|---|---|---|---|
| 7,511,460 | B1* | 3/2009 | Chen | G05F 1/70 |
| | | | | 323/222 |
| 7,511,463 | B2* | 3/2009 | Kumar | H02M 3/158 |
| | | | | 323/267 |
| 7,986,187 | B1 | 7/2011 | Nussbaum et al. | |
| 8,384,478 | B2 | 2/2013 | Nussbaum et al. | |
| 2002/0105599 | A1* | 8/2002 | Hong | H04L 27/066 |
| | | | | 348/726 |
| 2003/0103360 | A1 | 6/2003 | Hatta et al. | |
| 2004/0136300 | A1* | 7/2004 | Mouri | G11B 7/0053 |
| | | | | 369/53.33 |
| 2007/0025125 | A1 | 2/2007 | Nakahori et al. | |
| 2008/0315852 | A1* | 12/2008 | Jayaraman | H02M 1/4225 |
| | | | | 323/285 |
| 2009/0212756 | A1* | 8/2009 | Shao | H02M 1/4225 |
| | | | | 323/285 |
| 2010/0250638 | A1* | 9/2010 | Asami | H03H 17/0294 |
| | | | | 708/304 |
| 2010/0327765 | A1 | 12/2010 | Melanson et al. | |
| 2011/0292699 | A1* | 12/2011 | Goerke | H02M 1/15 |
| | | | | 363/84 |
| 2012/0262958 | A1* | 10/2012 | Feldtkeller | H02M 1/4208 |
| | | | | 363/44 |
| 2013/0069551 | A1 | 3/2013 | Kitamura et al. | |
| 2014/0334195 | A1 | 11/2014 | Nussbaum | |

FOREIGN PATENT DOCUMENTS

| | | |
|---|---|---|
| EP | 0647086 | 4/1995 |
| WO | WO 2013/046259 | 4/2013 |
| WO | WO 2014/182500 | 11/2014 |

OTHER PUBLICATIONS

Ciobotaru et al., "A New Single-Phase PLL Structure Based on Second Order Generalized Integrator," Proceedings of PESC, 1511-1516 (2006).

Jang et al., "Light-Load Efficiency Optimization Method," IEEE Transactions on Power Electronics, 25(1): 67-74 (2010).

Abramovitz et ah, "A Resonant Power Factor Conditioner," IEEE Power Electronics Specialists Conference (PESC 93), 995-1001, 1993.

Bersani, "Switch Mode Power Supply (SMPS) Topologies (PM't II)" (2009).

Bruemmer et al., "Efficient Design in a DC to DC Converter Unit," NASA/TM-2002-211804, IECEC-2002-20032, Aug. 2002.

Cuk et al., "Single-Stage Bridgeless Isolated PFC Converter Achieves 98% Efficiency," Power Electronics Technology, Oct. 2010.

Dixon, Jr., "Switching Power Supply Topology Review," (2001).

Gulko et al., "Current-Sourcing Push-Pull Parallel-Resonance Inverter (CS-PPRI): Theory and Application as a Fluorescent Lamp Driver," (1994).

Ivensky et al., "Current-Fed Multi-Resonant DC-DC Converter," IEEE Applied Power Electronics Conference (APEC '93) Record, pp. 58-64, Mar. 1993.

Jordan et at., "Resonant Fluorescent Lamp Converter Provides Efficient and Compact Solution," (1999).

Linear Technology, "Isolated No Opto-Coupler Flyback Controller with Active PFC," Linear Technology Corporation (2012).

Locher, "Optimizing the Ultra-Fast POWERplanar™ Rectifier Diode for Switching Power Supplies," National Superconductor, Jan. 1999.

Moschopoulos, et al., "Single-Phase Single-Stage Power-Factor-Corrected Converter Topologies," IEEE Transactions on Industrial Electronics, Voh 52, No. 1, Feb. 2005.

National Semiconductor, "Cascaded PWM Controller," Apr. 2004.

On Semiconductor, "SWITCHMODE™ Power Supply," Jul. 2002.

Texas Instruments, "Buck Current/Voltage Fed Push-Pull PWM Controllers," Apr. 1999 revised Apr. 2011.

Torrico Bascopé et al., "Isolated Flyback-Current-Fed Push-Pull Converter for Power Factor Correction," IEEE (1996).

Ulmann, "Preliminary Telecom Input Protection," Jun. 22, 2010.

Zhu, et al., "New Start-Up Schemes for Isolated Full-Bridge Boost Converters," IEEE Transactions on Power Electronics, vol. 18, No. 4, Jul. 2003.

International Search Report and Written Opinion;dated Sep. 26, 2014 for International application No. PCT/US2014/035822.

* cited by examiner

ADJUSTMENT OF CIRCUIT OPERATIONS IN RESPONSE TO AC LINE DISTORTION

TECHNICAL FIELD

This disclosure generally relates to adjustment of circuit operations in response to AC line distortion.

BACKGROUND

A variety of types of power supplies (also called power converters) provide an approximately constant (e.g., DC or "direct current") output voltage from a sinusoidal (e.g., AC or "alternating current") input voltage (e.g., from an AC mains source), thus providing AC-DC conversion (also called "rectification"). Other types of power supplies provide AC-AC conversion, DC-DC conversion, or DC-AC conversion (also called "inversion"). Some power supplies include multiple stages, which may include a combination of different types of converters, such as a DC-DC converter stage within a DC-AC power supply. Converter stages that provide a DC voltage may use a regulator to maintain the DC voltage near a constant value. A linear power supply uses a linear regulator, and a switched-mode (or "switching") power supply uses a switching regulator that switches between on and off states to regulate power transfer and maintain the DC voltage.

Distortion in the input voltage may introduce special concerns for power converter operations.

SUMMARY

In one aspect, in general, an example method for controlling a circuit may include determining an input signal in a circuit, the input signal comprising distortion; determining a fundamental component of the input signal; determining an error of the input signal using the input signal and the fundamental component; determining a distortion metric using the error; and controlling the circuit as a function of the distortion metric.

Aspects may include one or more of the following features. The input signal may be an alternating voltage.

Determining the input signal may comprise sampling the input signal. Determining the fundamental component may comprise passing the input signal through a digital band-pass filter.

Determining the error may comprise determining a difference between the input signal and the fundamental component.

Determining the distortion metric may comprise filtering the error to produce a filtered error; determining a peak of an absolute value of the filtered error; filtering the peak of the absolute value to produce a filtered peak of the absolute value, and constraining, by at least one of a predetermined minimum value and a predetermined maximum value, the filtered peak of the absolute value.

Determining the distortion metric may comprise filtering the error to produce a filtered error; determining a peak of an absolute value of the filtered error; filtering the peak of the absolute value to produce a filtered peak of the absolute value; normalizing, with respect to the input signal, the filtered peak of the absolute value; and constraining, by at least one of a predetermined minimum value and a predetermined maximum value, the normalized filtered peak of the absolute value. Normalizing the filtered peak of the absolute value may comprise dividing a peak of the input signal by the filtered peak of the absolute value.

Controlling the circuit as a function of the distortion metric may comprise dynamically determining a threshold value, where the threshold value is a function of the distortion metric; and toggling one or more switches of the circuit when a rectified input signal crosses the threshold value.

The one or more switches may be part of a switched-mode power supply. The switched-mode power supply may be a boost converter using zero-voltage switching with peak current mode control.

In one aspect, in general, an example circuit includes a voltage source configured to produce an alternating input voltage to the circuit; a control module configured to determine an amount of distortion in the alternating voltage; determine a threshold voltage based on the amount of distortion; and toggle one or more switches of the circuit when a voltage of a rectified input signal falls below the threshold voltage; a digital band-pass filter connected to the voltage source, to produce a fundamental component of the alternating voltage; a subtractor connected to the voltage source and the digital band-pass filter, to produce a difference between the alternating voltage and the fundamental component; a first low-pass filter connected to the subtractor, to produce a filtered difference; a peak detector connected to the first low-pass filter, to produce a peak of the absolute value of the filtered difference; a second low-pass filter connected to the peak detector, to produce a filtered peak of the absolute value; a divider device connected to the second low-pass filter, to produce a normalized filtered peak of the absolute value; a scaling device connected to the divider device, to produce a distortion metric, wherein the threshold voltage is dynamically modified as a function of the distortion metric.

All examples and features described herein, including this summary section, can be combined in any technically possible way to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

Like reference numbers represent corresponding parts and/or portions throughout.

DETAILED DESCRIPTION

Switched-mode power supplies ("SMPS") can be classified as having different types of circuit topologies. For example, some topologies include one or more stages that have certain arrangements of components that perform specific functions (e.g., buck, boost, or buck-boost stages). Some "isolated" circuit topologies provide "isolation" using a transformer to prevent certain current flows between isolated stages of the power supply. Examples of different circuit topologies that can be configured to provide isolation include, but are not limited to: full bridge, half bridge, and push-pull. These circuit topologies correspond to different arrangements of switches, and can be used in either isolated or non-isolated power supplies. Another example of a circuit topology that can be configured to provide isolation is flyback, which refers to a specific way of using a transformer. For example, a flyback converter topology can include a buck-boost DC-to-DC converter topology (e.g., a converter topology in which an output voltage magnitude is either greater or less than an input voltage magnitude) with a split inductor as the transformer. Certain classes of power supply are also identified by certain specific features of their circuit topology. For example, a power supply (whether switched-mode or linear) that operates directly from an AC mains source is called an "off-line" power supply.

Some power supply circuits use power factor correction (PFC) to increase the circuit's "power factor," which can be defined as the ratio of the total "active power" (the true power being drawn from the source) to the total "apparent power" drawn from the source (based on a vector sum of the true power and the reactive power at the output). Increasing the power factor reduces losses incurred in the upstream power distribution system. In some cases, power supplies with PFC functionality include two stages: a front end boost converter controlled as a PFC stage, and an isolated DC/DC converter as a second stage. Some two-stage converters have a number of positive attributes, including reduced total switch root mean square (RMS) current for a given output power, but tend to entail significant complexity, with many semiconductor switches and passive components (e.g., inductors and capacitors). For some applications, the ability to supply large peak power is useful. Power supplies for audio applications, for example, typically need to supply peak powers of at least 3 times the average power. Other attributes besides RMS currents at maximum output can dominate the economics and desirability of a power supply under these circumstances.

Some switched-mode power supplies utilize zero-voltage switching ("ZVS"), where a controller toggles a converter switch when the switch's drain-source voltage is approximately 0 Volts. Zero voltage switching can help reduce power expended during switch transitions and improve efficiency across a range of topologies.

Figure 1:
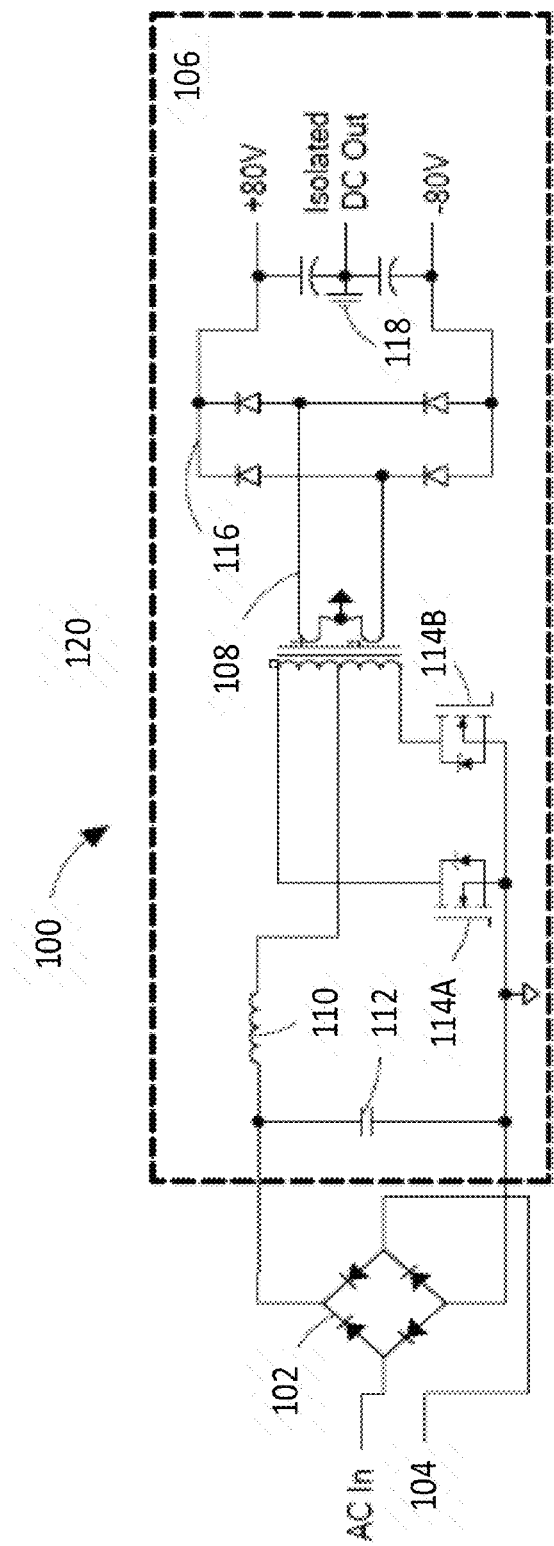
FIG. 1 shows an example circuit diagram of a power converter.

FIG. 1 shows an example converter with a current fed push-pull topology. This converter is similar to the converter shown and described as FIG. 2 in co-pending U.S. application Ser. No. 13/891,503 entitled "Managing Leakage Inductance in a Power Supply" and filed on May 10, 2013, the content of which is incorporated herein by reference in its entirety.

The example current fed push-pull converter shown in FIG. 1 may be adapted to utilize zero-voltage switching with peak current mode control. An example of steps performed using ZVS with peak current mode control, starting from when both switches S1 and S2 are closed, is: Step 1: Detect when the current through the inductor 110 rises above a specified current; Step 2: Open switch S1; Step 3: Detect when the voltage across S1 falls below a specified voltage; Step 4: Close switch S1; Step 5: Detect when the current through the inductor 110 rises above a specified current; Step 6: Open switch S2; Step 7: Detect when the voltage across S2 falls below a specified voltage; Step 8: Close switch S2; Repeat from Step 1. In this context, as well as commonly found in the literature, the term "peak current mode control" refers to the method of making the peak inductor current follow a specified current reference by means of opening the switches at the instants determined from comparing when the said peak inductor current rises above a specified current reference. Because of the current-fed nature of this converter, one of the switches remains closed while the other switch cycles through its open-closed transition.

In some implementations, the zero-voltage switching peak current mode control can only be achieved while the rectified AC line voltage remains above a minimum threshold value $V_{ac\_OnOff\_Min}$ at any instant in time. In other words, the converter may stop (and open both switches) when the rectified AC line voltage falls below $V_{ac\_OnOff\_min}$. In the case of a sinusoidal rectified AC input voltage with no distortion, the voltage just below $V_{ac\_OnOff\_Min}$ corresponds to a phase angle ($\theta^{min}$) around the zero crossing that may be represented as $$\theta_{min} = \sin^{-1}\left(\frac{V_{ac\_OnOff\_Min}}{V_{ac\_pk}}\right)$$

where $V_{ac\_pk}$ represents the peak rectified AC line voltage. The phase angle $\theta_{min}$ may represent an "inactive zone" around the line zero crossings where ZVS switching cannot be attained and both switches remain open.

When the AC line voltage is too small, the voltage across a switch (e.g., S2) may become too small to be detected and that switch may remain stuck in the open state (e.g., after step 6). This could lead to an incorrect switching pattern and/or a wrong stop. A wrong stop may arise from, for example, a time-out fault condition or an overcurrent hardware trip that informs the controller to open both switches prior to $\theta_{min}$.

Figure 2:
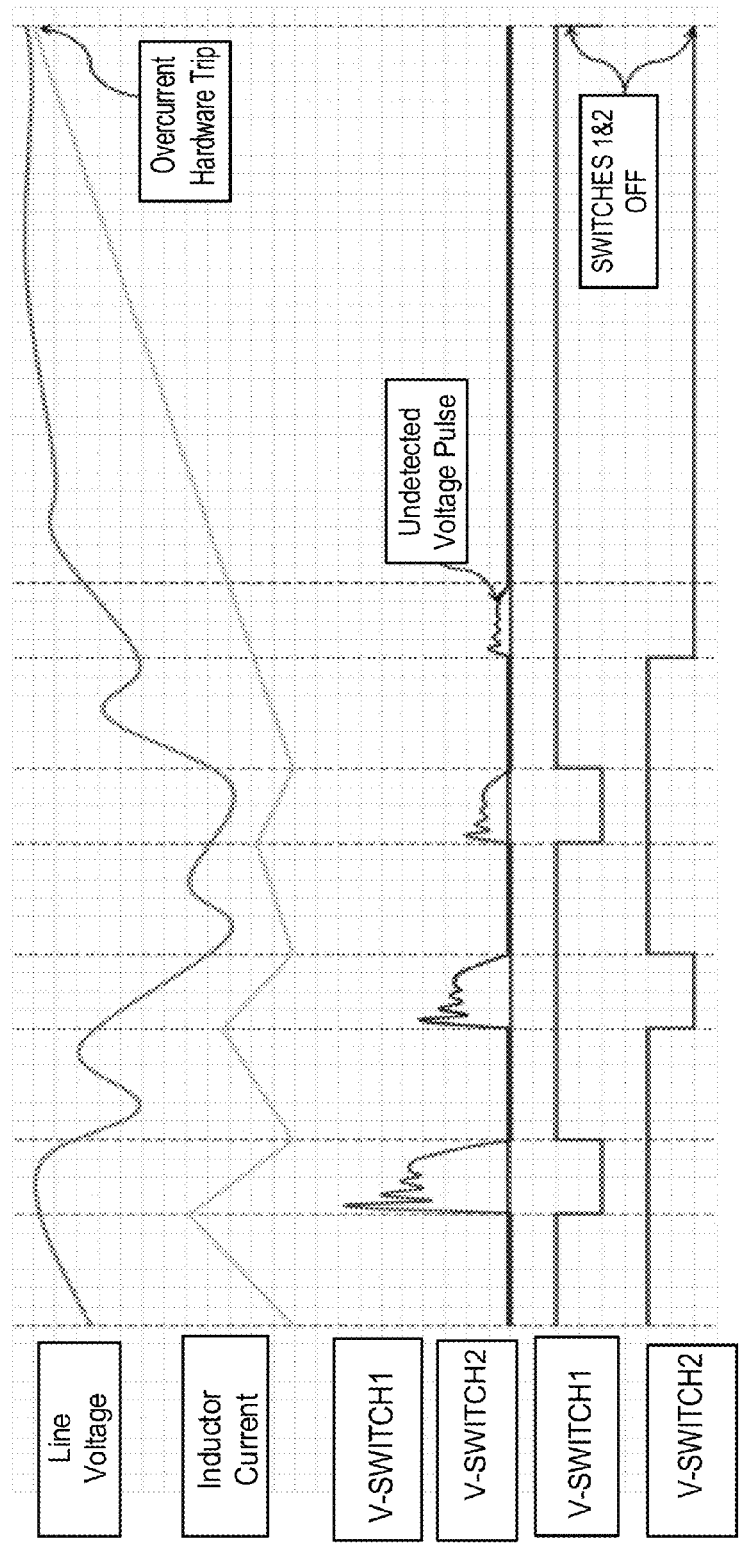
FIG. 2 shows an example plot.

A timeout fault condition may occur, for example, when there is an absence of an expected event. For example, the controller's failure to detect the voltage across a switch (e.g., S2) after it is opened (e.g., after step 6) may prompt a timeout fault condition. In some implementations, the timeout duration may be set to approximately 67 microseconds to allow normal converter operations above 20 kHz switching frequencies. But before the timeout occurs, the current transient through the other switch (e.g., S1) may become sufficiently large to trigger an overcurrent hardware trip. For example, as shown in FIG. 2, a large current transient may develop through S1 when the AC line voltage bounces back to a high voltage level after a sudden drop caused by distortion. An overcurrent hardware trip may cause the converter to completely shut down.

Figure 3:
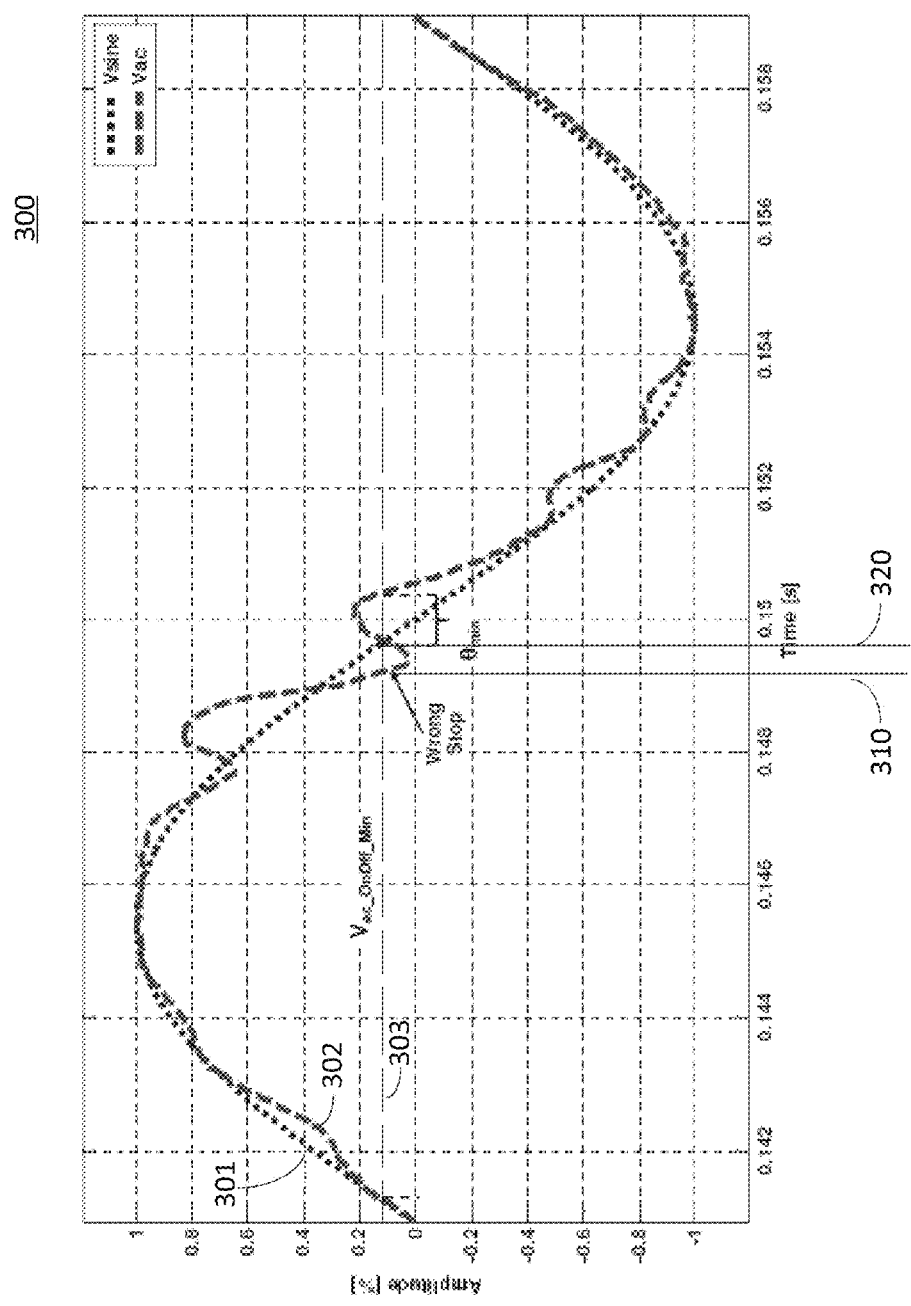
FIG. 3 shows an example graph of an ideal sinusoid waveform, a distorted sinusoid waveform (i.e. a sinusoid with distortion), and a constant threshold voltage.

FIG. 3 shows an example graph 300 of an ideal sinusoid waveform 301, a distorted sinusoid waveform 302 (i.e. a sinusoid with distortion), and the threshold voltage $V_{ac\_OnOff\_Min}$ 303. As shown in FIG. 3, distortion in the AC line voltage caused a wrong stop at time 310.

When there is too much distortion in the AC line voltage, it may be desirable to order a preventative stop before a wrong stop occurs. After the preventative stop, a restart attempt may be made in the very next half-cycle.

Recall that the example converter stops (and opens both switches) when the rectified AC line voltage falls below $V_{ac\_OnOff\_Min}$. In some implementations, the preventative stop may be effectuated by dynamically determining the threshold voltage $V_{ac\_OnOff\_Min}$ as a function of detected line distortion. For example, a controller may increase the value of $V_{ac\_OnOff\_Min}$ as the amount of distortion increases and/or decrease the value of $V_{ac\_OnOff\_Min}$ as the amount of distortion decreases. Further, in some implementations, the value of $V_{ac\_OnOff\_Min}$ may be constrained by minimum and maximum values represented as $V_{ac\_OnOff\_Min\_Lo}$ and $V_{ac\_OnOff\_Min\_Hi}$, respectively.

Figure 4:
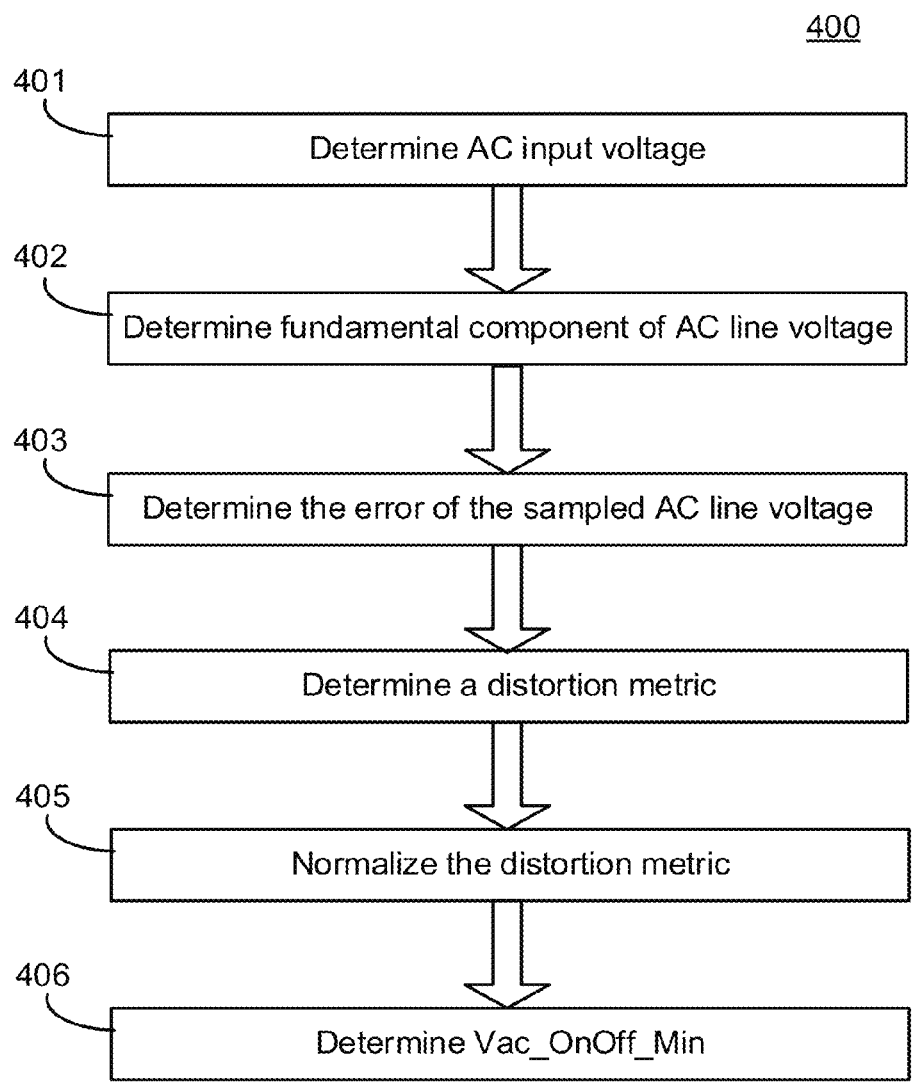
FIG. 4 shows an example method for dynamically determining a threshold voltage.
Figure 5:
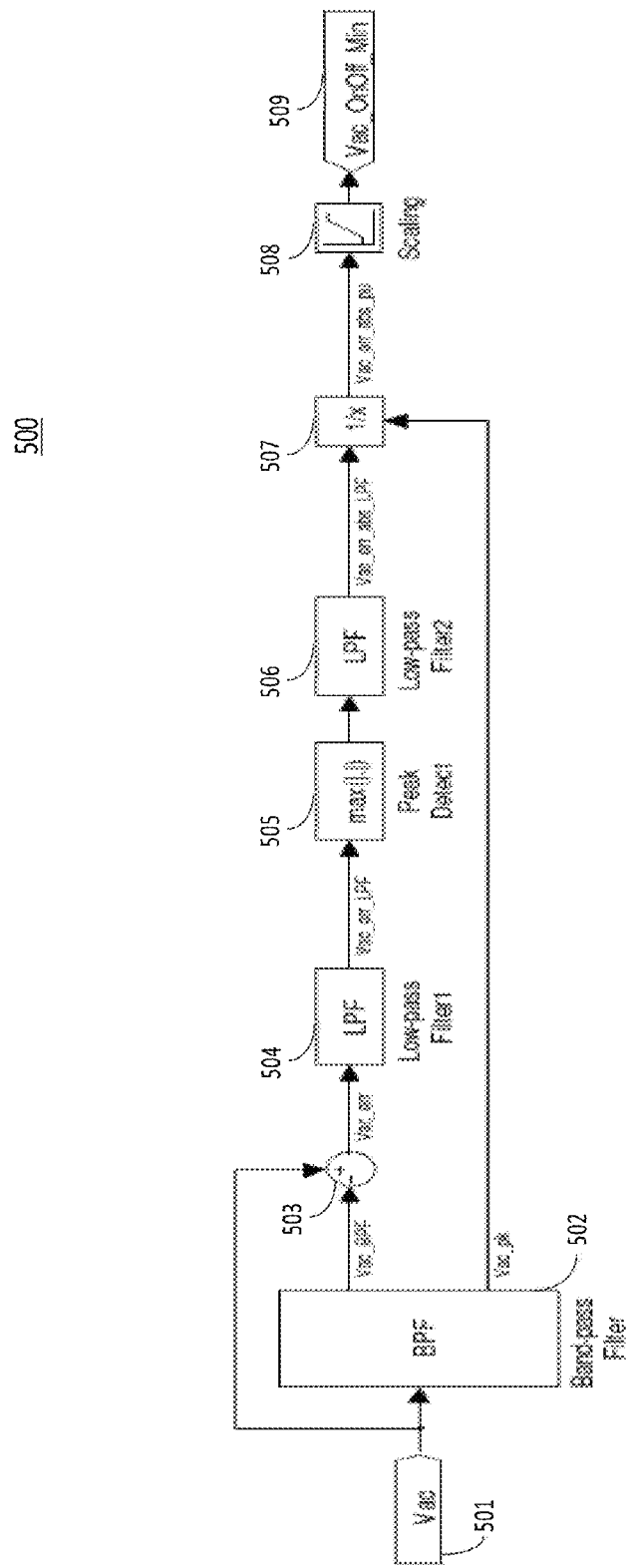
FIG. 5 shows an example block diagram for dynamically determining a threshold voltage.

FIG. 4 shows an example method 400 for dynamically determining a threshold voltage (e.g., $V_{ac\_OnOff\_Min}$) as a function of line distortion. FIG. 5 shows an example implementation of example method 400 using a block diagram 500.

In example operation 401, the AC line voltage 501 ($V_{ac}$) may be determined. For example, the AC line voltage may be determined by sampling the AC line voltage.

In example operation 402, $V_{ac\_BPF}$, the fundamental component (e.g., the lowest frequency component) of the AC line voltage ($V_{ac}$) 501, may be determined. For example, $V_{ac\_BPF}$ may be determined by inputting the AC line voltage ($V_{ac}$) into digital band-pass filter ("BPF") 502. Centering the digital BPF at the line frequency promotes noise rejection and may introduce insignificant phase delay/advance, in some cases.

In example operation 403, the error of the sampled AC line voltage ($V_{ac\_err}$) may be determined. For example, $V_{ac\_err}$ may be determined using subtractor 503 to determine the difference between $V_{ac}$ and $V_{ac\_BPF}$.

In example operation 404, a distortion metric may be determined. For example, a distortion metric may be determined by processing $V_{ac\_err}$. In some implementations, processing $V_{ac\_err}$ includes multiple operations. For example, in one implementation, $V_{ac\_err}$ may first be inputted into low-pass filter 504 to reduce the switching noise and ringing caused by the operation of the main converter switches, thereby yielding $V_{ac\_err\_LPF}$. Then, the peak of the absolute value of $V_{ac\_err\_LPF}$ may be determined and inputted into a second low-pass filter 506 to remove the AC component of the error, thereby yielding $V_{ac\_err\_abs\_LPF}$. The value of $V_{ac\_err\_abs\_LPF}$ represents an example distortion metric. Example cutoff frequencies of low-pass filter 504 and low-pass filter 506 are 800 Hz and 200 Hz, respectively, though other cutoff frequencies may be used.

In example operation 405, the distortion metric may be normalized. For example, a normalized distortion metric (e.g., $V_{ac\_err\_abs\_pu}$) may be obtained by dividing $V_{ac\_err\_abs\_LPF}$ by the AC peak voltage $V_{ac\_pk}$ using divider block 507. Normalizing the distortion metric makes it independent of the AC line voltage levels.

Figure 6:
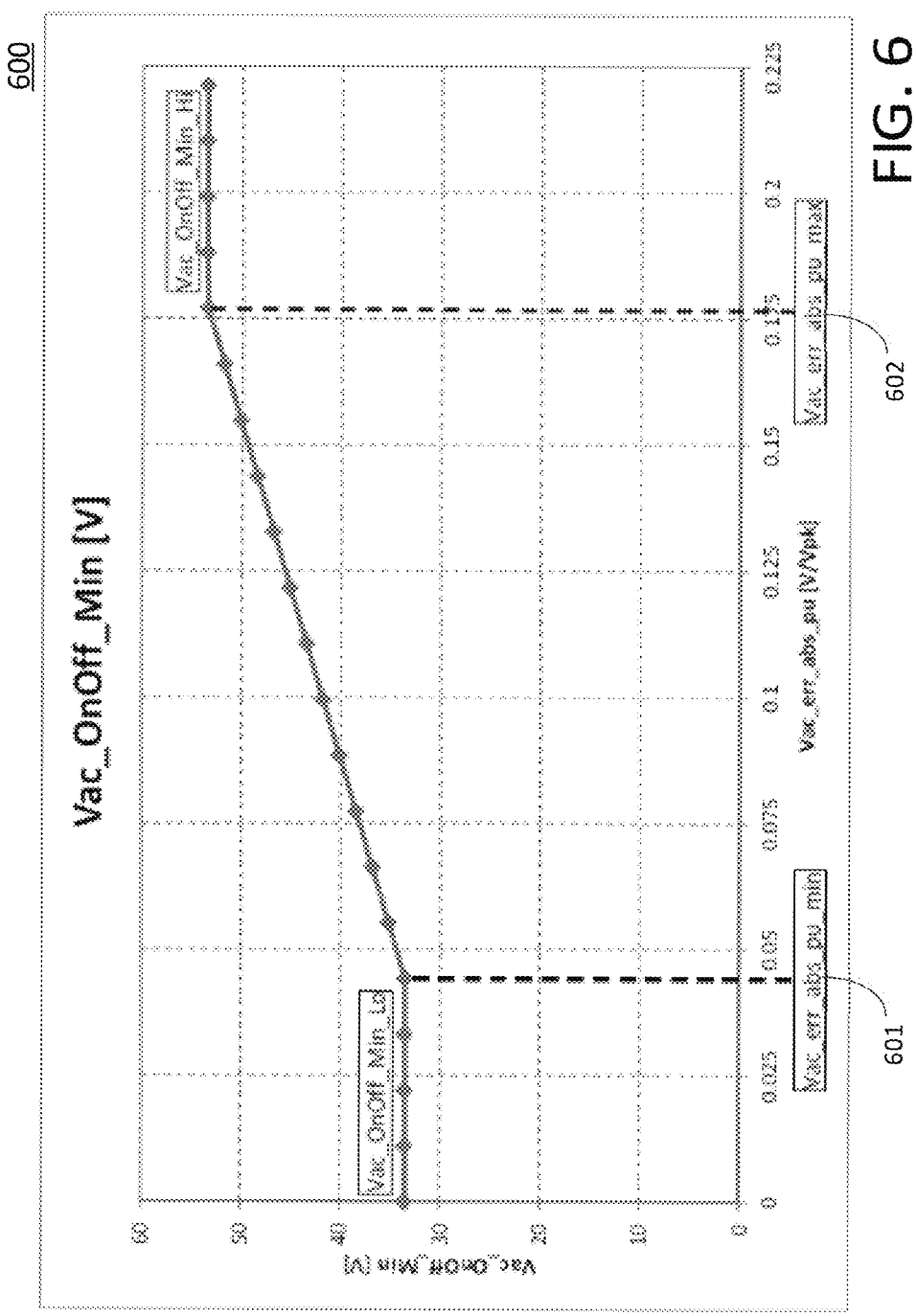
FIG. 6 shows an example graph of a dynamically determined threshold voltage.

In example operation 406, a new value of $V_{ac\_OnOff\_Min}$ 509 may be determined. For example, $V_{ac\_OnOff\_Min}$ may be determined by inputting $V_{ac\_err\_abs\_pu}$ into scaling block 508. FIG. 6 shows an example graph of $V_{ac\_OnOff\_Min}$ scaled as a function of $V_{ac\_err\_abs\_pu}$. As shown in FIG. 6, $V_{ac\_onoff\_Min}$ may increase as the normalized distortion metric $V_{ac\_err\_abs\_pu}$ increases. Further, the value of $V_{ac\_OnOff\_Min}$ may be constrained by $V_{ac\_OnOff\_Min\_Lo}$ 601 and $V_{ac\_OnOff\_Min\_Hi}$ 602. The scaling of $V_{ac\_OnOff\_Min}$, and the values of $V_{ac\_OnOff\_Min\_Lo}$ and $V_{ac\_OnOff\_Min\_Hi}$, shown in FIG. 6 are not intended to be limiting, and may be different for different circuits.

The bandwidth associated with the BPF may represent a tradeoff between (a) a fast transient detection and (b) a slow settling time of the BPF's output after the transient ends. If the BPF's bandwidth is relatively narrow, there may be relatively fast transient detection because the BPF's output has less distortion and the transient detection is based upon the difference between the unfiltered AC line voltage and the BPF's output. However, the BPF may be slow to settle to the new AC line characteristics after the transient ends, potentially indicating the presence of a transient event that expired in the past. For example, if the AC line amplitude is instantly reduced and remains reduced, the BPF may inaccurately indicate that a transient event exists some time after the transient ended. Conversely, if the BPF's bandwidth is relatively wide, there may be relatively slow transient detection but the BPF's output have a relatively fast settling time. One example of a band-pass filter is a phase-locked loop. Example cutoff frequencies of BPF 502 are $f_{bpf\_c1}$=14 Hz and $f_{bpf\_c2}$=212 Hz, though other cutoff frequencies may be used.

Figure 7:
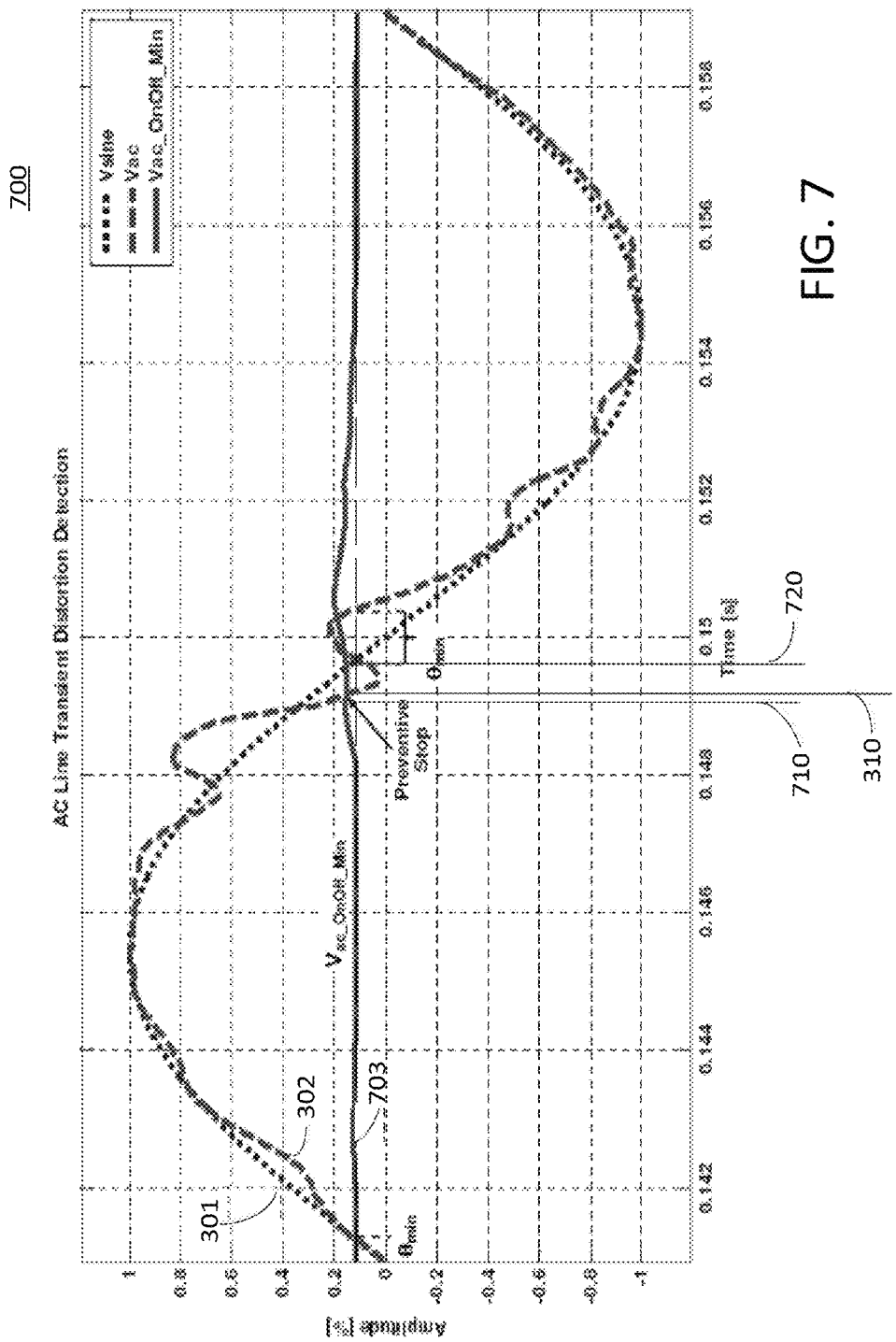
FIG. 7 shows an example graph of an ideal sinusoid waveform, a distorted sinusoid waveform, and a dynamically determined threshold voltage.

FIG. 7 shows an example graph 700 of an ideal sinusoid waveform 301, a distorted sinusoid waveform 302 (i.e. a sinusoid with distortion), and a dynamically-determined threshold voltage, $V_{ac\_OnOff\_Min}$ 703. As shown in FIG. 7, rather than remaining constant throughout the AC line cycle, $V_{ac\_OnOff\_Min}$ varies throughout the cycle in response to line distortion. For example, from the time just after 148 ms through almost 154 ms, $V_{ac\_OnOff\_Min}$ is increased in response to an increase in the AC line distortion (as shown by the distorted sinusoid waveform 302). As a result, assuming the same underlying converter topology is used as in FIG. 1, the controller will order a preventative stop of the converter (i.e., the converter will be shut down) at time 710. Without this preventative stop, the converter may have stopped at a later time and been more likely to experience an incorrect zero-voltage switching pattern that triggered an overcurrent hardware trip.

The preventative stop may, for example, stop the converter until the very next AC half-cycle when an attempt to restart operations may be made. The restart may be delayed until $\theta_{min}$ after the next AC half-cycle (and after the rectified AC line voltage rises above $V_{ac\_OnOff\_Min}$) to prevent the converter from operating during AC voltage, growing non-monotonically and causing current misbehavior. In some implementations, if the normalized distortion metric is determined to be relatively high (i.e., the level of distortion is relatively high), the restart may be deferred an additional half-cycle or beyond. In some implementations, the restart may be deferred until no more cycle skipping can be tolerated and a fault condition is asserted.

In the above examples, $\theta_{min}$ is not dynamically determined. In other implementations, $\theta_{min}$ is dynamically determined. For example, $\theta_{min}$ may be dynamically determined as a function of line distortion.

Various advantages of the overall design and operation of the different implementations of the systems and method disclosed herein, as applied in the context of a switched-mode power supply, include reduced cost and increased performance. Additionally, by constraining current conduction to a more conservative region within each AC half-cycle, the converter may be maintained in operation longer or may be able to function when plugged into voltage sources containing high harmonic levels, for example originating from the under-filtered output of a six-step or multi-level inverter connected to a portable diesel engine generator.

The techniques described below may be applied in any of a variety of devices and systems that have or receive an alternating signal. Thus, the methods disclosed herein may also be applied in circuits other than switched-mode power supplies. For example, these methods may also be applied in an inverter circuit or an amplifier circuit.

Though the elements of several views of the drawings may be shown and described as discrete elements in a block diagram and may be referred to as "circuitry," unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals or video signals or both may be encoded and transmitted in either digital or analog form; conventional digital to-analog or analog-to-digital converters may not be shown in the figures.

Any "electrical connection" as used and/or described herein may imply a direct physical connection or a connection that includes intervening components but that nevertheless allows electrical signals (including wireless signals) to flow between connected components. Any "connection" involving electrical circuitry mentioned and/or described herein, unless stated otherwise, is an electrical connection and not necessarily a direct physical connection regardless of whether the word "electrical" is used to modify "connection."

Some elements can be implemented using multiple discrete elements combined into one element that serves a desired function. Elements of different implementations described herein may be combined to form other examples not specifically set forth above. Elements may be left out of the structures described herein without adversely affecting their operation. Furthermore, various separate elements may be combined into one or more individual elements to perform the functions described herein. For example, low-pass filters may be replaced with band-pass filters that are configured to pass a sufficiently high frequency. As another example, a low-pass filter may be used to filter the AC line voltage 501 before subtractor 503 in order to reduce the switching noise and ringing caused by the operation of the main converter switches. In some implementations, this low-pass filter may be used instead of low-pass filter 504. As yet another example, band-pass filter 502 may incorporate the functionality associated with subtractor 503 by using a feedback arrangement of filters and may also incorporate the functionality associated with low-pass filter 504 by using a multiple-stage (cascaded) arrangement of band-pass filters or nested-loop feedback arrangement of filters.

A number of implementations have been described. Nevertheless, it will be understood that additional modifications may be made without departing from the scope of the inventive concepts described herein, and, accordingly, other examples are within the scope of the following claims.

Systems and techniques described herein, or portions thereof, can be implemented as a computer program product that includes instructions that are stored on one or more non-transitory machine-readable storage media, and that are executable on one or more processing devices. The systems and techniques described herein, or portions thereof, can be implemented as an apparatus, method, or electronic system that can include one or more processing devices and memory to store executable instructions to implement the stated operations. For example, it should be understood by one of skill in the art that any computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component.

What is claimed is:

1. A method for controlling a circuit, comprising:
   determining an input signal in a circuit, the input signal comprising distortion;
   determining a fundamental component of the input signal, wherein determining the fundamental component comprises passing the input signal through a digital band-pass filter;
   determining an error of the input signal using the input signal and the fundamental component;
   determining a distortion metric using the error; and
   controlling the circuit as a function of the distortion metric.

2. The method of claim 1, wherein the input signal is an alternating voltage.

3. The method of claim 1, wherein:
   determining the input signal comprises sampling the input signal.

4. The method of claim 1, wherein determining the error comprises determining a difference between the input signal and the fundamental component.

5. The method of claim 1, wherein determining the distortion metric comprises:
   filtering the error to produce a filtered error;
   determining a peak of an absolute value of the filtered error; and
   filtering the peak of the absolute value to produce a filtered peak of the absolute value.

6. The method of claim 5, wherein determining the distortion metric further comprises constraining, by at least one of a predetermined minimum value and a predetermined maximum value, the filtered peak of the absolute value.

7. The method of claim 5, wherein determining the distortion metric further comprises normalizing, with respect to the input signal, the filtered peak of the absolute value.

8. The method of claim 7, wherein normalizing the filtered peak of the absolute value comprises dividing a peak of the input signal by the filtered peak of the absolute value.

9. The method of claim 8, wherein determining the distortion metric further comprises constraining, by at least one of a predetermined minimum value and a predetermined maximum value, the normalized filtered peak of the absolute value.

10. The method of claim 1, wherein controlling the circuit as a function of the distortion metric comprises:
    dynamically determining a threshold value, where the threshold value is a function of the distortion metric; and
    toggling one or more switches of the circuit when a rectified input signal crosses the threshold value.

11. The method of claim 10, wherein the one or more switches are part of a switched-mode power supply.

12. The method of claim 11, wherein the switched-mode power supply is a boost converter configured to utilize zero-voltage switching with peak current mode control.

13. The method of claim 1, wherein:
the input signal is an alternating voltage;
determining the input signal comprises sampling the input signal;
determining the error comprises determining a difference between the input signal and the fundamental component;
determining the distortion metric comprises filtering the error to produce a filtered error; determining a peak of an absolute value of the filtered error; filtering the peak of the absolute value to produce a filtered peak of the absolute value; and normalizing, with respect to the input signal, the filtered peak of the absolute value; and
controlling the circuit as a function of the distortion metric comprises dynamically determining a threshold value, where the threshold value is a function of the distortion metric; and toggling one or more switches of the circuit when a rectified input signal crosses the threshold value.

14. The method of claim 13, wherein the one or more switches are part of a switched-mode power supply.

15. The method of claim 14, wherein the switched-mode power supply is a boost converter using zero-voltage switching.

16. A method for controlling a circuit, comprising:
determining an amount of distortion in an input voltage to the circuit, wherein the amount of distortion is determined as a difference between the input voltage and a fundamental component of the input voltage, the fundamental component of the input voltage being determined by passing the input voltage through a digital band-pass filter;
dynamically modifying a threshold voltage based on the amount of distortion; and
toggling one or more switches of the circuit when a rectified input voltage crosses the threshold voltage.

17. A circuit, comprising:
a voltage source configured to produce an alternating input voltage to the circuit;
a digital band-pass filter connected to the voltage source, the digital band-pass filter configured to receive the input voltage and generate a fundamental component of the input voltage; and
a control module configured to:
determine an amount of distortion in the alternating input voltage,
determine a threshold voltage based on the amount of distortion, and
toggle one or more switches of the circuit when a voltage of a rectified input signal falls below the threshold voltage.

18. The circuit of claim 17, further comprising:
a subtractor connected to the voltage source and the digital band-pass filter, to produce a difference between the alternating voltage and the fundamental component;
a first low-pass filter connected to the subtractor, to produce a filtered difference;
a peak detector connected to the first low-pass filter, to produce a peak of the absolute value of the filtered difference; and
a second low-pass filter connected to the peak detector, to produce a distortion metric, wherein the threshold voltage is dynamically modified as a function of the distortion metric.

19. The circuit of claim 17, further comprising:
a subtractor connected to the voltage source and the digital band-pass filter, to produce a difference between the alternating voltage and the fundamental component;
a first low-pass filter connected to the subtractor, to produce a filtered difference;
a peak detector connected to the first low-pass filter, to produce a peak of the absolute value of the filtered difference;
a second low-pass filter connected to the peak detector, to produce a filtered peak of the absolute value; and
a divider device connected to the second low-pass filter, to produce a normalized filtered peak of the absolute value, to produce a distortion metric, wherein the threshold voltage is dynamically modified as a function of the distortion metric.

20. The circuit of claim 17, further comprising:
a subtractor connected to the voltage source and the digital band-pass filter, to produce a difference between the alternating voltage and the fundamental component;
a first low-pass filter connected to the subtractor, to produce a filtered difference;
a peak detector connected to the first low-pass filter, to produce a peak of the absolute value of the filtered difference;
a second low-pass filter connected to the peak detector, to produce a filtered peak of the absolute value;
a divider device connected to the second low-pass filter, to produce a normalized filtered peak of the absolute value; and
a scaling device connected to the divider device, to produce a distortion metric, wherein the threshold voltage is dynamically modified as a function of the distortion metric.

* * * * *